(12) United States Patent
Kouno et al.

(10) Patent No.: US 10,262,886 B2
(45) Date of Patent: Apr. 16, 2019

(54) ELECTROSTATIC CHUCK DEVICE

(71) Applicant: SUMITOMO OSAKA CEMENT CO., LTD., Tokyo (JP)

(72) Inventors: Hitoshi Kouno, Tokyo (JP); Kentaro Takahashi, Tokyo (JP); Fumihiro Gobou, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 192 days.

(21) Appl. No.: 15/510,224

(22) PCT Filed: Sep. 24, 2015

(86) PCT No.: PCT/JP2015/076890
§ 371 (c)(1),
(2) Date: Mar. 9, 2017

(87) PCT Pub. No.: WO2016/052291
PCT Pub. Date: Apr. 7, 2016

(65) Prior Publication Data
US 2017/0287764 A1 Oct. 5, 2017

(30) Foreign Application Priority Data

Sep. 30, 2014 (JP) .................................. 2014-201302
Sep. 30, 2014 (JP) .................................. 2014-201303

(51) Int. Cl.
*H01L 21/683* (2006.01)
*H01L 21/687* (2006.01)
(Continued)

(52) U.S. Cl.
CPC ...... *H01L 21/6833* (2013.01); *H01L 21/3065* (2013.01); *H01L 21/67109* (2013.01);
(Continued)

(58) Field of Classification Search
CPC .. H01L 21/6833; H01L 21/6831; H02N 13/00
(Continued)

(56) References Cited

U.S. PATENT DOCUMENTS 8,043,971 B2 * 10/2011 Sasaki ................. H01J 7/32642
156/345.44
9,733,624 B2 * 8/2017 Rosani .............. A61F 13/15772
(Continued)

FOREIGN PATENT DOCUMENTS

JP 2002-033376 A 1/2002
JP 2006-128677 A 5/2006
(Continued)

OTHER PUBLICATIONS

JP-2005-064460; Plasma procession apparatus, focus ring, and holding apparatus of work; Publication Date: Oct. 3, 2005. (Year: 2005).*
(Continued)

*Primary Examiner* — Dharti H Patel
(74) *Attorney, Agent, or Firm* — Merchant & Gould P.C.

(57) ABSTRACT

Disclosed is an electrostatic chuck device for increasing electrostatic adsorptive force for a focus ring and uniformly cooling the focus ring. In such a device, a mounting table has a holder in the periphery of a placing surface along the circumferential direction of a focus ring, the holder has a pair of banks in the circumferential direction, and an annular groove formed between these banks, and in at least a bank on an outer circumferential position of the focus ring among the pair of the banks, a micro-protruding part including a plurality of micro-protrusions is on a surface facing the focus ring, or convex parts are on a bottom of the groove. The convex parts do not contact the focus ring, and the pair (Continued)

of banks or plurality of micro-protrusions contacts the focus ring and electrostatically adsorbs the focus ring in coordination with the convex parts.

15 Claims, 2 Drawing Sheets

(51) Int. Cl.
    *H01L 21/67*     (2006.01)
    *H02N 13/00*     (2006.01)
    *H05K 7/20*     (2006.01)
    *H01L 21/3065*     (2006.01)
    *B23Q 3/15*     (2006.01)

(52) U.S. Cl.
    CPC .... *H01L 21/6831* (2013.01); *H01L 21/68735* (2013.01); *H02N 13/00* (2013.01); *H05K 7/20009* (2013.01); *B23Q 3/15* (2013.01)

(58) Field of Classification Search
    USPC ........................................................ 361/234
    See application file for complete search history.

(56) References Cited

U.S. PATENT DOCUMENTS

| | | | | |
|---|---|---|---|---|
| 2004/0261946 A1* | 12/2004 | Endoh | ............... | H01J 37/32082 156/345.15 |
| 2005/0101137 A1* | 5/2005 | Kato | ................ | H01J 37/32082 438/689 |
| 2010/0071850 A1* | 3/2010 | Himori | ............. | H01J 37/32091 156/345.44 |
| 2011/0116207 A1* | 5/2011 | Sato | .................... | H01L 21/6831 361/234 |
| 2012/0247954 A1* | 10/2012 | Yamawaku | ....... | H01J 37/32091 204/298.31 |
| 2014/0146434 A1* | 5/2014 | Uchida | ............... | H01L 21/6831 361/234 |
| 2014/0209245 A1* | 7/2014 | Yamamoto | ........ | H01J 37/32091 156/345.53 |
| 2014/0254061 A1* | 9/2014 | Shiraiwa | ............ | H01L 21/6831 361/234 |

FOREIGN PATENT DOCUMENTS

| | | |
|---|---|---|
| JP | 4039645 B | 1/2008 |
| JP | 2010-135851 A | 6/2010 |
| JP | 4547182 B | 9/2010 |
| JP | 2012-134375 A | 7/2012 |
| JP | 5063797 B | 10/2012 |

OTHER PUBLICATIONS

JP-2012-134375; Substrate process apparatus and substrate processing method; Publication date: Dec. 7, 2012; (Year: 2012).*
International Search Report for PCT/JP2015/076890 (dated Dec. 15, 2015).
Office Action for Japanese Patent Application No. 2017-065308, dated Dec. 4, 2018.

* cited by examiner

ELECTROSTATIC CHUCK DEVICE

The present application is a National Stage Application under 35 U.S.C. § 371of International Application No. PCT/JP2015/076890 filed Sep. 24, 2015, which claims the benefit of priority to Japanese Patent Application No. 2014-201302 filed Sep. 30, 2014 and Japanese Patent Application No. 2014-201303 filed Sep. 30, 2014, the disclosures of all of which are hereby incorporated by reference in their entireties. The International Application was published in Japanese on Apr. 7, 2016 as WO 2016/052291.

TECHNICAL FIELD

The present invention relates to an electrostatic chuck device and, in more detail, to an electrostatic chuck device that is preferably used in vacuum process devices such as etching devices, sputtering devices, and CVD devices which are applied to the manufacturing processes of semiconductor devices, liquid crystal display devices, and the like.

BACKGROUND ART

Recently, in the manufacturing processes of semiconductors, in response to enhancement of the integration or performance of elements, there has been a demand for additional improvements in fine processing techniques. Among these manufacturing processes of semiconductors, etching techniques are one type of important fine processing techniques. Recently, among etching techniques, plasma etching techniques have been mainstreamed due to their capability of highly efficient fine processes of large areas.

Plasma etching techniques are one type of dry etching techniques. Plasma etching techniques are techniques in which fine patterns are formed in solid materials in the following fashion.

A mask pattern is formed on a solid material which is a process subject using a resist. Next, in a state in which the solid material is supported in a vacuum, a reactive gas is introduced into the vacuum, and a high-frequency electric field is applied to the reactive gas. Then, accelerated electrons collide with gas molecules and thus fall into a plasma state, and radicals (free radicals) generated from this plasma and ions react with the solid material, thereby producing a reaction product. In addition, this reaction product is removed, thereby forming a fine pattern on the solid material.

Meanwhile, as thin film-growing techniques in which raw material gas is chemically combined together through the action of plasma and the obtained compound is deposited on a substrate, there is, for example, a plasma CVD method. The plasma CVD method is a film-forming method in which plasma discharge is caused by applying a high-frequency electric field to gas including raw material molecules, the raw material molecules are decomposed using electrons accelerated by the plasma discharge, and the obtained compound is deposited. Reactions that are not caused by thermal excitation alone at a low temperature become possible in plasma since gas in the system collides with each other and is activated, thereby forming radicals.

In semiconductor-manufacturing devices in which plasma is used such as plasma etching devices and plasma CVD devices, in the related art, an electrostatic chuck device in which wafers can be easily mounted and fixed on a specimen table and be maintained at a desired temperature is used. This electrostatic chuck device includes, in the upper part, a ring member (focus ring) which surrounds the wafer-placing surface and is disposed at the outer circumferential edge of a wafer adsorption part.

However, in plasma etching devices of the related art, when plasma is radiated to a wafer fixed to the electrostatic chuck device, the surface temperature of the wafer increases. Therefore, in order to prevent the increase in the surface temperature of wafers, a cooling medium such as water is circulated in a base part for adjusting the temperature of the electrostatic chuck device so as to cool the wafer from the lower side.

For electrostatic chuck devices, techniques in which the uniformity of the temperature at the outer circumference of wafers is improved by providing second electrostatic adsorption means for adsorbing the focus ring to the outer circumference of the wafer are known (for example, refer to Patent Literature No. 1). In these techniques, second electrostatic adsorption means is provided, whereby the focus ring is adsorbed to an electrostatic chuck part with a force greater than the force that adsorbs wafers, and a cooling medium (cooling gas) is blown to the rear surface of the focus ring, thereby adjusting the temperature of the focus ring and making the surface temperature of the wafers uniform.

In addition, techniques in which gas-providing parts are provided to the wafer adsorption part adsorbed using the electrostatic chuck part and the focus ring and the temperatures of the wafer adsorption part and the focus ring are respectively and independently controlled, whereby the uniformity of the surface temperature of wafers are improved are known (for example, refer to Patent Literature No. 2). In these techniques, a protruding part is formed on the contact surface of the electrostatic chuck part which is in contact with the focus ring or the surface roughness of the contact surface is increased along the circumferential direction of the electrostatic chuck part, whereby the heat-transferring area in the electrostatic chuck part, which is formed by cooling gas, is increased and cooling gas is communicated between the electrostatic chuck part and the focus ring. In addition, in these techniques, a groove is formed on a part of the electrostatic chuck part which is in contact with the focus ring, whereby the diffusivity of cooling gas in the focus ring is improved.

CITATION LIST

Patent Literature

[Patent Literature No. 1] Japanese Laid-open Patent Publication No. 2002-033376
[Patent Literature No. 2] Japanese Laid-open Patent Publication No. 2012-134375

SUMMARY OF INVENTION

Technical Problem

However, when only the force for adsorbing the focus ring is increased as in the techniques described in Patent Literature No. 1, there has been a problem in that it is not possible to reliably control the surface temperature of wafers.

In addition, in the techniques described in Patent Literature No. 2, since the contact area between the protruding part formed in the electrostatic chuck part and the focus ring is small, there has been a problem in that the force for adsorbing the focus ring to the electrostatic chuck part is insufficient and the focus ring cannot be sufficiently cooled.

In addition, when the surface roughness of the contact surface of the electrostatic chuck part is increased along the circumferential direction of the electrostatic chuck part, it is not possible to obtain the sufficient flow of cooling gas in the thickness direction of the focus ring, and thus there has been a problem in that it is not possible to uniformly cool wafers (the focus ring). Furthermore, in a case in which a groove is formed in the electrostatic chuck part, a temperature difference is caused between the groove and other parts, and thus there has been a problem in that it is not possible to uniformly cool wafers (the focus ring).

The present invention has been made in consideration of the above-described circumstances, and an object of the present invention is to provide an electrostatic chuck device capable of increasing the force for electrostatically adsorbing a focus ring and uniformly cooling the focus ring.

Solution to Problem

As a result of intensive studies for solving the above-described problems, the present inventors found that, when a holder for electrostatically adsorbing a focus ring is provided along the circumferential direction of the focus ring and has a pair of banks for placing the focus ring thereon and an annular groove formed between these banks, convex parts are provided on the bottom of the groove, a micro-protruding part comprising a plurality of micro-protrusions is formed on a surface facing the focus ring in at least a bank on an outer circumferential position of the focus ring among the pair of the banks, furthermore, a cooler provides a heat-transferring gas to the groove, and the pair of the banks is in contact with the focus ring in coordination with the convex parts which are not in contact with the focus ring or the plurality of the micro-protrusions is in contact with the focus ring, thereby electrostatically adsorbing the focus ring, it is possible to increase the force for electrostatically adsorbing the focus ring using the holder and uniformly cool the focus ring, and completed the present invention.

An electrostatic chuck device of the present invention comprises a mounting table provided with a placing surface on which a plate-like specimen is to be placed; an annular focus ring being placed on the mounting table and surrounding a periphery of the placing surface; and a cooler for cooling the mounting table and the focus ring, the mounting table comprises a holder for electrostatically adsorbing the focus ring, the holder being provided in a periphery of the placing surface along a circumferential direction of the focus ring, the holder comprises a pair of banks being provided in a circumferential direction and being for placing the focus ring thereon, and an annular groove formed between the pair of the banks, the cooler provides a heat-transferring gas to the groove, convex parts are provided on a bottom of the groove, the pair of the banks is in contact with the focus ring, the convex parts are not in contact with the focus ring, and the pair of the banks and the convex parts electrostatically adsorb the focus ring in a coordinating fashion.

Alternatively, the electrostatic chuck device of the present invention comprises a mounting table provided with a placing surface on which a plate-like specimen is to be placed; an annular focus ring being placed on the mounting table and surrounding a periphery of the placing surface; and a cooler for cooling the mounting table and the focus ring, the mounting table comprises a holder for electrostatically adsorbing the focus ring, the holder being provided in a periphery of the placing surface along a circumferential direction of the focus ring, the holder comprises a pair of banks being provided in a circumferential direction and being for placing the focus ring thereon, and an annular groove formed between the pair of the banks, a micro-protruding part comprising a plurality of micro-protrusions is formed on a surface facing the focus ring in at least a bank on an outer circumferential position of the focus ring among the pair of the banks, the cooler provides a heat-transferring gas to the groove, and the plurality of the micro-protrusions is in contact with the focus ring and electrostatically adsorbs the focus ring.

Advantageous Effects of Invention

According to the present invention, it is possible to provide an electrostatic chuck device capable of increasing the force for electrostatically adsorbing a focus ring and uniformly cooling the focus ring.

DESCRIPTION OF EMBODIMENTS

Embodiments of an electrostatic chuck device of the present invention will be described.

Meanwhile, the present embodiments are simply specific description for better understanding of the gist of the invention and does not limit the present invention unless particularly otherwise described.

[Electrostatic Chuck Device]

Figure 1:
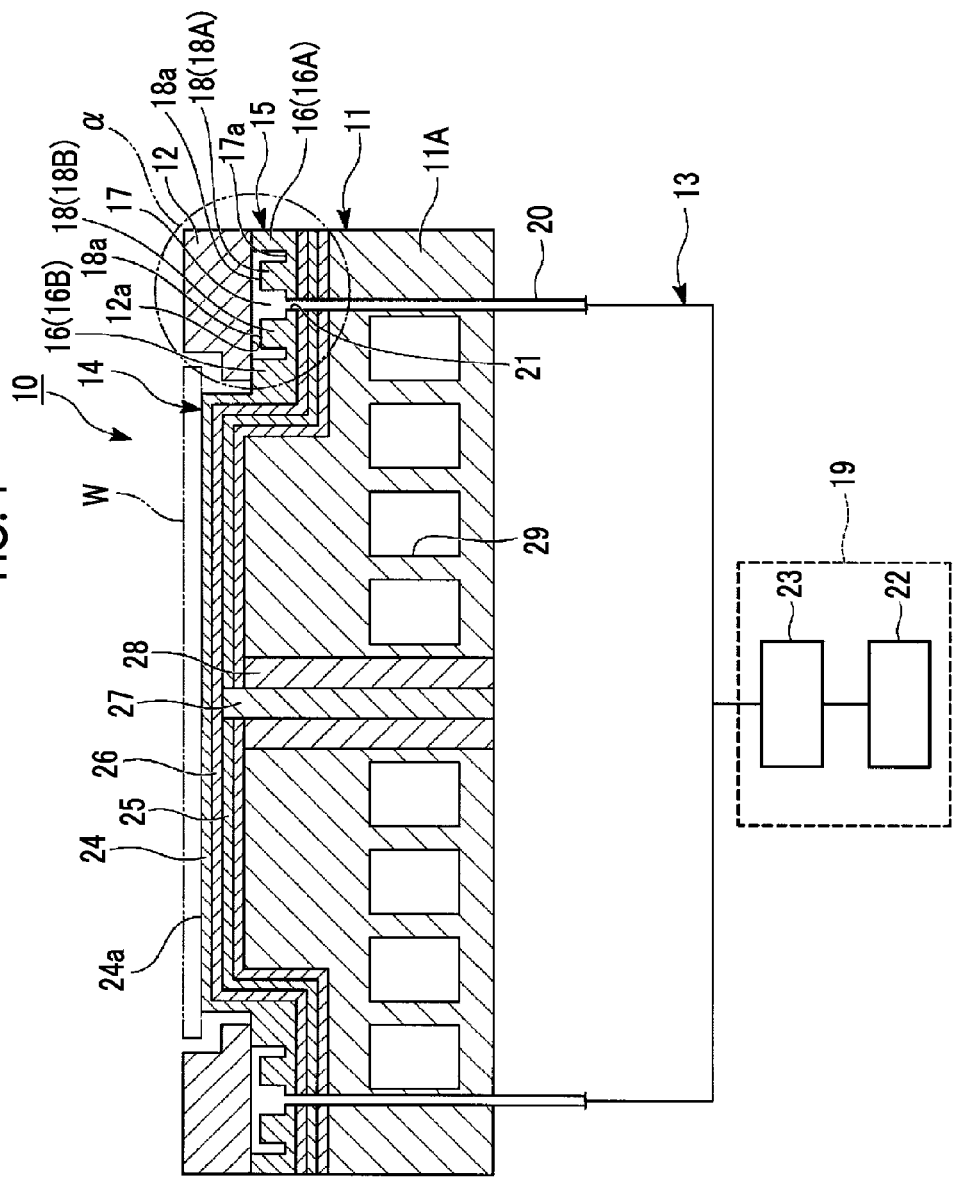
FIG. 1 is a schematic cross-sectional view illustrating an embodiment of an electrostatic chuck device of the present invention.
Figure 2:
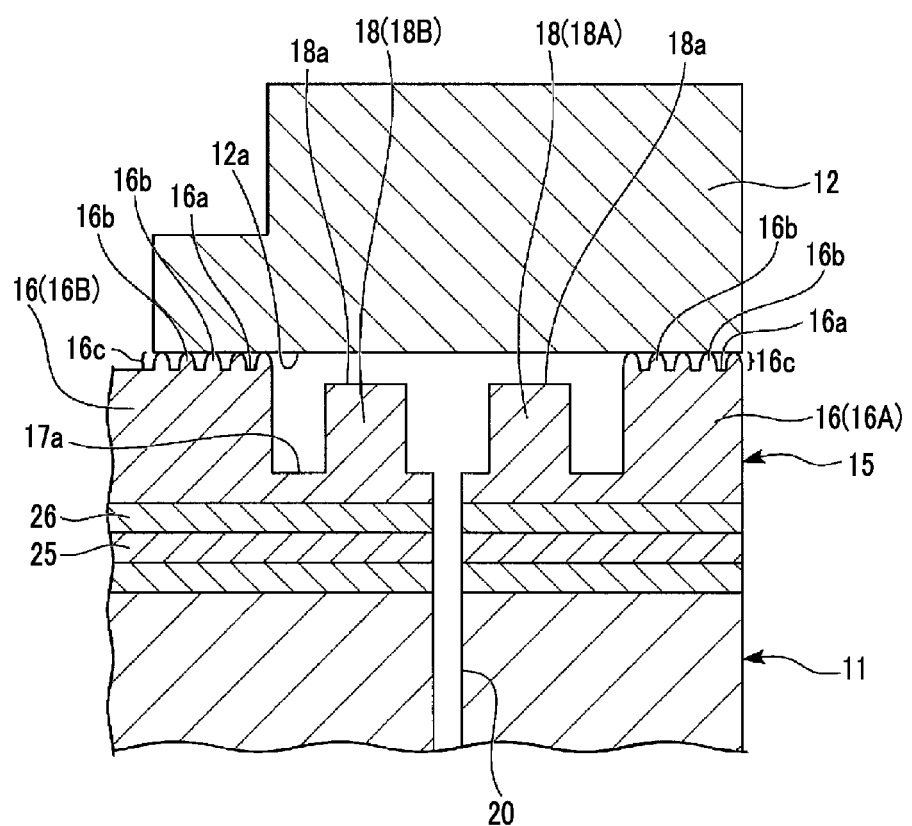
FIG. 2 is a schematic cross-sectional view illustrating an embodiment of the electrostatic chuck device of the present invention and is a partial enlarged view illustrating a region indicated by α in FIG. 1 in an enlarged fashion.

FIG. 1 is a schematic cross-sectional view illustrating an embodiment of an electrostatic chuck device of the present invention, and FIG. 2 is a schematic cross-sectional view illustrating an embodiment of the electrostatic chuck device of the present invention and is a partial enlarged view illustrating a region indicated by α in FIG. 1 in an enlarged fashion.

An electrostatic chuck device 10 of the present embodiment is schematically constituted of a mounting table 11 provided with a placing surface (a placing surface (upper surface) 24a of a dielectric layer 24 described below) on which a plate-like specimen W is to be placed, an annular focus ring 12 being placed on the mounting table 11 and surrounding the periphery of the placing surface (the placing surface 24a), and a cooler 13 for cooling the mounting table 11 and the focus ring 12.

The mounting table 11 has a mounting table main body 11A, a disc-like electrostatic chuck part 14 being provided on the mounting table main body 11A and having the placing surface (the placing surface 24a), and a holder 15 being provided in the periphery of the placing surface (the placing surface 24a) along the circumferential direction of the focus ring 12 and being for electrostatically adsorbing the focus ring 12.

The holder 15 has a pair of banks 16 (16A and 16B) being provided in the circumferential direction of the focus ring 12 and being for placing the focus ring 12 thereon, and an annular groove 17 formed between the pair of the banks 16. On a bottom 17a of the groove 17, convex parts 18 are provided, the convex parts protruding toward a surface for placing the focus ring 12 (in the thickness direction of the holder 15) in the bank 16.

In the pair of the banks 16, on a surface 16a facing the focus ring 12, a micro-protruding part 16c including a plurality of micro-protrusions 16b, 16b, . . . may be formed.

When the focus ring 12 is placed on the holder 15, as illustrated in FIG. 1, the pair of the banks 16 (16A and 16B) or the micro-protrusions 16b, 16b, . . . formed on the surfaces 16a facing the focus ring 12 in the pair of the banks (16A and 16B) come into contact with the focus ring 12, and the convex parts 18 do not come into contact with the focus ring 12. That is, there is a space (void) between a lower surface 12a of the focus ring 12 and a peak (upper surface) 18a of the convex part 18 or the surface 16a facing the focus ring 12 in the bank 16. In addition, there is also a space (void) between the lower surface 12a of the focus ring 12 and the peak (upper surface) 18a of the convex part 18, and the size of the space, that is, the distance between the lower surface 12a of the focus ring 12 and the peak (upper surface) 18a of the convex part 18 is not particularly limited, but is set so that an electrostatic adsorptive force acts between the focus ring 12 and the convex parts 18. In a case in which the micro-protrusions 16b, 16b, . . . are provided on the surfaces 16a facing the focus ring in the banks 16 (16A and 16B), only the micro-protrusions 16b, 16b, . . . in the banks 16 come into contact with the lower surface 12a of the focus ring 12, and thus the banks 16 electrostatically adsorb the focus ring 12 while the lower surface 12a of the focus ring 12 is not contact with the surfaces 16a facing the focus ring 12 in the banks 16.

The size of the space (void) between the lower surface 12a of the focus ring 12 and the surface 16a facing the focus ring 12 in the bank 16, that is, the height of the micro-protrusions 16b, 16b, . . . from the surface 16a facing the focus ring 12 in the bank 16 is not particularly limited, but is set so that a heat-transferring gas provided into the groove 17 by the cooler 13 can be communicated.

In addition, the size of the space (void) between the lower surface 12a of the focus ring 12 and the peak (upper surface) 18a of the convex part 18, that is, the distance between the lower surface 12a of the focus ring 12 and the peak (upper surface) 18a of the convex part 18 is not particularly limited, but is set so that an electrostatic adsorptive force acts between the focus ring 12 and the convex parts 18.

In the pair of the banks 16, the amount of the heat-transferring gas flowing out of the bank 16A on the outer circumferential position of the focus ring 12 is larger than the amount of the heat-transferring gas flowing out of the other bank 16B.

Examples of a specific constitution for providing a difference in the amounts of the heat-transferring gas flowing out of the pair of the banks 16 as described above include two constitutions described below.

The distance between the plurality of the micro-protrusions 16b, 16b, . . . provided on the bank 16A on the outer circumference of the focus ring 12 is set to be larger than the distance between the plurality of micro-protrusions 16b, 16b, . . . provided on the bank 16B on the inner circumference of the focus ring 12. When the above-described constitution is provided, a larger amount of the heat-transferring gas provided into the groove 17 by the cooler 13 flows outside from the bank 16A in which the distance of the micro-protrusions 16b, 16b, . . . is larger. Therefore, it is possible to uniformly cool the focus ring 12.

Meanwhile, in the bank 16A, the distance between the micro-protrusions 16b, 16b, . . . is not particularly limited, but is set so that a larger amount of the heat-transferring gas flows outside from the bank 16A rather than from the bank 16B.

In addition, the height of the micro-protrusions 16b, 16b, . . . provided on the bank 16A on the outer circumference of the focus ring 12 is larger than that of the micro-protrusions 16b, 16b, . . . provided on the bank 16B on the inner circumference of the focus ring 12. When the above-described constitution is provided, a larger amount of the heat-transferring gas provided into the groove 17 by the cooler 13 flows outside from the bank 16A in which the height of the micro-protrusions 16b, 16b, . . . is larger. Therefore, it is possible to uniformly cool the focus ring 12.

Meanwhile, in the bank 16A, the height of the micro-protrusions 16b, 16b, . . . is not particularly limited, but is set so that a larger amount of the heat-transferring gas flows outside from the bank 16A rather than from the bank 16B.

The convex part 18 is constituted of, for example, a plurality of columnar protruded parts 18A, 18B, . . . . The protruded parts 18A, 18B, . . . are provided away from each other. In a case in which the electrostatic chuck device 10 (the holder 15) is seen in a planar view, the protruded parts 18A, 18B, . . . are provided throughout the entire region of the groove 17. The intervals between the protruded parts 18A, 18B, . . . are not particularly limited.

In addition, the convex part 18 may be constituted of, for example, a plurality of protruded strips 18A, 18B, . . . . The protruded strips 18A, 18B, . . . are provided away from each other. In a case in which the electrostatic chuck device 10 (the holder 15) is seen in a planar view, the protruded strips 18A, 18B, . . . may have an annular shape so that the protruded strips continue with each other along the annular groove 17 or may have a discontinuous arc shape so that the protruded strips are provided at intervals. In a case in which the protruded strips 18A, 18B, . . . have an annular shape so that the protruded strips continue with each other along the annular groove 17, the protruded strips 18A, 18B, . . . are provided concentrically with the groove 17. The intervals between the protruded strips 18A, 18B, . . . are not particularly limited.

When the convex part 18 is constituted of the plurality of the protruded parts 18A, 18B, . . . , the area of the convex parts 18 (the combined area of all of the protruded parts 18A, 18B, . . . ) is preferably 10% or more and 80% or less and more preferably 20% or more and 50% or less of the area of the groove 17 (the area of the bottom 17a of the groove 17) in a case in which the electrostatic chuck device 10 (the holder 15) is seen in a planar view.

When the area of the convex parts 18 is less than 10% of the area of the groove 17, the electrostatic adsorptive force acting between the protruded parts 18A, 18B, . . . and the focus ring 12, that is, the force that attracts the focus ring 12 to the protruded parts 18A, 18B, . . . excessively weakens, and thus it is not possible to fix the focus ring 12 to the holder 15. On the other hand, when the area of the convex parts 18 exceeds 80% of the area of the groove 17, the space between the lower surface 12a of the focus ring 12 and the peak (upper surface) 18a of the convex part 18 becomes too small, and thus the amount of heat-transferring gas flowing through the space becomes small. As a result, the effect of cooling the focus ring 12 using heat-transferring gas becomes weak, and a difference is caused between the surface temperature of the focus ring 12 and the surface temperature of the plate-like specimen W, and consequently, the in-plane temperature of the plate-like specimen W also becomes unstable.

When the convex part 18 is constituted of the plurality of the protruded strips 18A, 18B, . . . , the area of the convex parts 18 (the combined area of all of the protruded strips 18A, 18B, . . . ) is preferably 10% or more and 80% or less and more preferably 20% or more and 50% or less of the area of the groove 17 (the area of the bottom 17a of the groove 17) in a case in which the electrostatic chuck device 10 (the holder 15) is seen in a planar view.

When the area of the convex parts 18 is less than 10% of the area of the groove 17, the electrostatic adsorptive force acting between the protruded strips 18A, 18B, . . . and the focus ring 12, that is, the force that attracts the focus ring 12 to the protruded strips 18A, 18B, . . . excessively weakens, and thus it is not possible to fix the focus ring 12 to the holder 15. On the other hand, when the area of the convex parts 18 exceeds 80% of the area of the groove 17, the space between the lower surface 12a of the focus ring 12 and the peak (upper surface) 18a of the convex part 18 becomes too small, and thus the amount of heat-transferring gas flowing through the space becomes small. As a result, the effect of cooling the focus ring 12 using heat-transferring gas becomes weak, and a difference is caused between the surface temperature of the focus ring 12 and the surface temperature of the plate-like specimen W, and consequently, the in-plane temperature of the plate-like specimen W also becomes unstable.

The distance between the lower surface 12a of the focus ring 12 and the peak (upper surface) 18a of the convex part 18 is preferably 1 µm or more and 10 µm or less and more preferably 2 µm or more and 5 µm or less.

When the distance between the lower surface 12a of the focus ring 12 and the peak (upper surface) 18a of the convex part 18 is less than 1 µm, the space between the lower surface 12a of the focus ring 12 and the peak (upper surface) 18a of the convex part 18 becomes too small, and thus the amount of heat-transferring gas flowing through the space becomes small. As a result, the effect of cooling the focus ring 12 using heat-transferring gas becomes weak, and a difference is caused between the surface temperature of the focus ring 12 and the surface temperature of the plate-like specimen W, and consequently, the in-plane temperature of the plate-like specimen W also becomes unstable. On the other hand, when the distance between the lower surface 12a of the focus ring 12 and the peak (upper surface) 18a of the convex part 18 exceeds 10 µm, the electrostatic adsorptive force acting between the protruded strips 18A, 18B, . . . and the focus ring 12, that is, the force that attracts the focus ring 12 to the protruded strips 18A, 18B, . . . excessively weakens, and thus it is not possible to fix the focus ring 12 to the holder 15.

The depth of the groove 17 needs to be set so that the flow of heat-transferring gas for cooling the focus ring 12 is not inhibited in the groove 17 and is preferably 10 µm to 50 µm.

The cooler 13 includes a heat-transferring gas provider 19. The heat-transferring gas provider 19 is formed so that heat-transferring gas is provided to the groove 17 through a gas flow channel 20 communicated from the bottom 17a at a predetermined pressure. Specifically, the gas flow channel 20 penetrates the mounting table 11 in the thickness direction of the mounting table and is communicated with a number of gas holes 21 provided on the bottom 17a of the groove 17. The gas holes 21 are formed on almost the entire surface of the bottom 17a of the groove 17.

To the gas flow channel 20, a heat-transferring gas provision source 22 for providing heat-transferring gas is connected through a pressure control valve 23. The pressure control valve 23 is a member for adjusting the flow amount so that the pressure of heat-transferring gas reaches a predetermined pressure. Meanwhile, the number of the gas flow channels 20 for providing heat-transferring gas from the heat-transferring gas provision source 22 maybe one or plural.

The electrostatic chuck part 14 in the mounting table 11 is schematically constituted of a circular dielectric layer 24 the upper surface (one main surface) of which is used as the placing surface (upper surface) 24a for placing the plate-like specimen W such as a semiconductor wafer, a circular insulating layer 25 being placed opposite to the lower surface (the other main surface) of the dielectric layer 24 and having the same diameter as that of the dielectric layer 24, a circular inner electrode for electrostatic adsorption 26 being sandwiched by the dielectric layer 24 and the insulating layer 25 and having a diameter smaller than those of the dielectric layer 24 and the insulating layer 25, a terminal for power feeding 27 being connected to a central portion of the lower surface of the inner electrode for electrostatic adsorption 26 and applying a direct-current voltage, and a tubular insulating insulator 28 for insulating the terminal for power feeling by covering the periphery of the terminal for power feeding 27.

The holder 15 in the mounting table 11 is schematically constituted of an annular dielectric layer 24 constituted of the banks 16, the groove 17, and the convex parts 18, the annular insulating layer 25 being placed opposite to the lower surface of the dielectric layer 24 and having the same diameter as that of the dielectric layer 24, and the annular inner electrode for electrostatic adsorption 26 being sandwiched by the dielectric layer 24 and the insulating layer 25 and having a diameter smaller than those of the dielectric layer 24 and the insulating layer 25.

The respective layers constituting the electrostatic chuck part 14 and the respective layers constituting the holder 15 are in contact with each other. That is, the inner electrode for electrostatic adsorption 26 constituting the holder 15 is also electrically connected to the terminal for power feeding 27.

A material for forming both the dielectric layer 24 and the insulating layer 25 is preferably heat-resistant ceramic, and the ceramic is preferably one type of ceramic selected from aluminum nitride (AlN), aluminum oxide (alumina, $Al_2O_3$), silicon nitride ($Si_3N_4$), zirconium oxide ($ZrO_2$), yttrium oxide ($Y_2O_3$), sialon, boron nitride (BN), and silicon carbide (SiC) or complex ceramic consisting of two or more types selected from the group.

Particularly, in the dielectric layer 24, the placing surface (upper surface) 24a serves as an electrostatic adsorption surface, and thus it is preferable to select a material having a high dielectric constant and not acting as an impurity with respect to the plate-like specimen W to be electrostatically adsorbed, and, for example, a silicon carbide-aluminum oxide compound material (sintered body) including 4% by weight or more and 20% by weight or less of silicon carbide with aluminum oxide (alumina) as a remainder is preferred.

In addition, in order to form the banks 16, the groove 17, and the convex parts 18 having a predetermined size in the dielectric layer 24 in the electrostatic chuck part 14, the material for forming the dielectric layer 24 preferably has an average crystal grain diameter of 10 µm or less and more preferably has an average crystal grain diameter of 2 µm or less. When the average crystal grain diameter in the material for forming the dielectric layer 24 is 10 µm or less, it is possible to form the banks 16, the groove 17, and the convex parts 18 in a predetermined size.

As the inner electrode for electrostatic adsorption 26, a conductive ceramic flat plate having a thickness of approximately 10 μm to 50 μm is used. The volume intrinsic resistance value of the inner electrode for electrostatic adsorption 26 at the operation temperature of the electrostatic chuck device 10 is preferably $1.0 \times 10^6$ Ω·cm or less and more preferably $1.0 \times 10^4$ Ω·cm or less.

Examples of the conductive ceramic constituting the inner electrode for electrostatic adsorption 26 include silicon carbide (SiC)-aluminum oxide ($Al_2O_3$) complex sintered bodies, tantalum nitride (TaN)-aluminum oxide ($Al_2O_3$) complex sintered bodies, tantalum carbide (TaC)-aluminum oxide ($Al_2O_3$) complex sintered bodies, molybdenum carbide ($Mo_2C$)-aluminum oxide ($Al_2O_3$) complex sintered bodies, and the like.

The focus ring 12 is made of an annular plate material having an inner diameter being slightly larger than the diameter of the electrostatic chuck part 14. The focus ring 12 is electrostatically adsorbed to the banks 16 in the holder 15.

The focus ring 12 is controlled so as to have the same temperature as that of the plate-like specimen W in treatment steps such as plasma etching, and thus, in a case in which the focus ring is used in oxide film etching, polycrystalline silicon, silicon carbide, or the like is preferably used as a material for the focus spring.

The mounting table main body 11A is provided below the electrostatic chuck part 14, the holder 15, and the focus ring 12 and is a member for controlling the temperatures of the electrostatic chuck part 144, the holder 15, and the focus ring 12 to a desired temperature and additionally including an electrode for generating high frequencies. The mounting table main body has a flow channel 29 circulating a cooling medium such as water or an organic solvent formed therein and is constituted so as to be capable of maintaining the temperature of the plate-like specimen W being placed on the upper surface 24a of the dielectric layer 24 to a desired temperature.

Examples of a material for forming the mounting table main body 11A include metal having favorable thermal conductivity such as aluminum and compound materials made up of aluminum oxide (alumina, $Al_2O_3$) and silicon carbide (SiC).

In addition, below the insulating layer 25, a heater (not illustrated) for controlling the temperature of the focus ring 12 to the same temperature as that of the plate-like specimen W by heating the temperature of the focus ring 12 to a predetermined temperature at an arbitrary temperature increase rate may be provided. In addition, a thermometer for measuring the temperature maybe connected to the heater or the focus ring 12. Furthermore, a temperature controller and a heater power supply are connected to the thermometer.

As described above, according to the electrostatic chuck device 10 of the present embodiment, the holder 15 for electrostatically adsorbing the focus ring 12 has the pair of the banks 16 being provided along the circumferential direction of the focus ring 12 and being for placing the focus ring 12 and the annular groove 17 formed between these banks 16, the cooler 13 provides heat-transferring gas to the groove 17, the convex parts 18 are provided on the bottom 17a of the groove 17, the pair of the banks 16 are in contact with the focus ring 12, the convex parts 18 are not in contact with the focus ring 12, the pair of the banks 16 and the convex parts 18 electrostatically adsorb the focus ring 12 in a coordination fashion, or, in the pair of the banks 16, the micro-protruding part 16c including the plurality of the micro-protrusions 16b, 16b, . . . is formed on the surface 16a facing the focus ring 12, and the micro-protrusions 16b, 16b, . . . come into contact with the lower surface 12a of the focus ring 12 when the focus ring 12 is placed on the holder 15. Therefore, it is possible to increase the force for electrostatically adsorbing the focus ring 12 to the holder 15 (electrostatic adsorptive force), and consequently, the focus ring 12 can be sufficiently cooled using heat-transferring gas provided into the groove 17 by the cooler 13. In addition, since the focus ring 12 is electrostatically adsorbed while the convex parts 18 do not come into contact with the focus ring 12 or only the micro-protrusions 16b, 16b, . . . in the banks 16 come into contact with the lower surface 12a of the focus ring 12, and thus the banks 16 electrostatically adsorb the focus ring 12 while the lower surface 12a of the focus ring 12 does not come into contact with the surfaces 16a facing the focus ring 12 in the banks 16, in a state in which the focus ring 12 is electrostatically adsorbed, there is a space (void) between the lower surface 12a of the focus ring 12 and the peak (upper surface) 18a of the convex part 18 or between the lower surface 12a of the focus ring 12 and the surface 16a facing the focus ring 12 in the bank 16, and thus it is possible to communicate heat-transferring gas provided into the groove 17 in this space, and the entire focus ring 12 can be uniformly cooled by the heat-transferring gas.

As a result, it is possible to adjust the temperature of the focus ring 12 and maintain the temperature of the focus ring 12 under treatments constant. Therefore, it is possible to stabilize the temperature of the outer circumferential part of the plate-like specimen W such as a silicon wafer and thus the etching characteristics in the plane of the plate-like specimen W can be uniformed.

In addition, since it is possible to accurately adjust the surface temperature of the focus ring 12, a temperature difference between the surface temperature of the focus ring 12 and the surface temperature of the plate-like specimen W being placed on the electrostatic chuck part 14 can be eliminated, and thus it is possible to prevent accumulated substances from being accumulated on the focus ring 12.

Meanwhile, in the present embodiment, a case in which the micro-protruding part 16c including the plurality of the micro-protrusions 16b, 16b, . . . is formed on the surfaces 16a facing the focus ring 12 in the pair of the banks 16 has been exemplified, but the present invention is not limited thereto. In the present embodiment, since the micro-protruding part including the plurality of the micro-protrusions is formed on the surface facing the focus ring in at least the bank on the outer circumferential position of the focus ring among the pair of the banks, in the pair of the banks, the amount of heat-transferring gas flowing out of the bank on the outer circumferential position of the focus ring becomes larger than the amount of heat-transferring gas flowing out of the other bank on the inner circumferential position of the focus ring.

In addition, in the present embodiment, a case in which the convex parts 18 are provided on the bottom 17a of the annular groove 17 formed between the pair of the banks 16 has been exemplified, but the present invention is not limited thereto. In the present invention, the convex parts may not be provided on the bottom of the groove.

REFERENCE SIGNS LIST

10 . . . electrostatic chuck device, 11 . . . mounting table, 11A . . . mounting table main body, 12 . . . focus ring, 13 . . . cooler, 14 . . . electrostatic chuck part, 15 . . . holder, 16 . . . bank, 16b . . . micro-protrusion, 16c . . . micro-protruding part, 17 . . . groove, 18 . . . convex part, 19 . . . heat-transferring gas provider, 20 . . . gas flow channel, 21 . . . gas hole, 22 . . . heat-transferring gas provision source, 23 . . . pressure control valve, 24 . . . dielectric layer, 24a placing surface, 25 . . . insulating layer, 26 . . . inner electrode for electrostatic adsorption, 27 . . . terminal for power feeding, 28 . . . insulating insulator, 29 . . . flow channel.

The invention claimed is:

1. An electrostatic chuck device, comprising:
a mounting table provided with a placing surface on which a plate-like specimen is to be placed;
an annular focus ring being placed on the mounting table and surrounding a periphery of the placing surface; and
a cooler for cooling the mounting table and the focus ring; wherein
the mounting table comprises a holder for electrostatically adsorbing the focus ring, the holder being provided in a periphery of the placing surface along a circumferential direction of the focus ring,
the holder comprises a pair of banks being provided in a circumferential direction and being for placing the focus ring thereon, and an annular groove formed between the pair of the banks,
the cooler provides a heat-transferring gas to the groove,
convex parts are provided on a bottom of the groove,
the pair of the banks is in contact with the focus ring,
the convex parts are not in contact with the focus ring, and
the pair of the banks and the convex parts electrostatically adsorb the focus ring in a coordinating fashion.

2. The electrostatic chuck device according to claim 1, wherein the convex part comprises a plurality of protruding portions.

3. The electrostatic chuck device according to claim 1, wherein the convex part comprises protruded strips.

4. The electrostatic chuck device according to claim 1, wherein an area of the convex parts is 10% or more and 80% or less of an area of the groove.

5. The electrostatic chuck device according to claim 1, wherein a distance between a lower surface of the focus ring and a peak of the convex part is 1 μm or more and 10 μm or less.

6. The electrostatic chuck device according to claim 1, wherein
the mounting table comprises a placing surface made of a dielectric layer, in which a material for forming the dielectric layer is one type of ceramic selected from the group consisting of: aluminum nitride (AlN), aluminum oxide ($Al_2O_3$), silicon nitride ($Si_3N_4$), yttrium oxide ($Y_2O_3$), and silicon carbide (SiC); or a complex ceramic consisting of two or more types selected from the group.

7. The electrostatic chuck device according to claim 6, wherein the material for forming the dielectric layer is ceramics material having an average crystal grain diameter of 10 μm or less.

8. An electrostatic chuck device, comprising:
a mounting table provided with a placing surface on which a plate-like specimen is to be placed;
an annular focus ring being placed on the mounting table and surrounding a periphery of the placing surface; and
a cooler for cooling the mounting table and the focus ring; wherein
the mounting table comprises a holder for electrostatically adsorbing the focus ring, the holder being provided in a periphery of the placing surface along a circumferential direction of the focus ring,
the holder comprises a pair of banks being provided in a circumferential direction and being for placing the focus ring thereon, and an annular groove formed between the pair of the banks,
a micro-protruding part comprising a plurality of a micro-protrusions is formed on a surface facing the focus ring in at least on a bank on an outer circumferential position of the focus ring among the pair of the banks,
the cooler provides a heat-transferring gas to the groove, and
the plurality of the micro-protrusions is in contact with the focus ring and electrostatically adsorbs the focus ring.

9. The electrostatic chuck device according to claim 8, wherein
the micro-protruding part is formed on a surface facing the focus ring in both of the pair of the banks, and
the plurality of the micro-protrusions is in contact with the focus ring and electrostatically adsorbs the focus ring.

10. The electrostatic chuck device according to claim 9, wherein a distance between the plurality of the micro-protrusions provided on the bank on the outer circumference of the focus ring is larger than a distance between the plurality of micro-protrusions provided on the bank on the inner circumference of the focus ring.

11. The electrostatic chuck device according to claim 9, wherein a height of the plurality of the micro-protrusions provided on the bank on the outer circumference of the focus ring is higher than a height of the plurality of the micro-protrusions provided on the bank on the inner circumference of the focus ring.

12. The electrostatic chuck device according to claim 8, wherein an amount of the heat-transferring gas flowing out of one of the pair of the banks on an outer circumferential position of the focus ring is larger than an amount of the heat-transferring gas flowing out of the other bank of the pair.

13. The electrostatic chuck device according to claim 8, wherein
convex parts are provided on a bottom of the groove, and
the convex parts are not in contact with the focus ring, and electrostatically adsorb the focus ring.

14. The electrostatic chuck device according to claim 13, wherein the convex part comprises a plurality of protrusions.

15. The electrostatic chuck device according to claim 13, wherein the convex part comprises protruding strips.

* * * * *